(12) United States Patent
Ballantyne et al.

(10) Patent No.: US 7,062,240 B2
(45) Date of Patent: Jun. 13, 2006

(54) AUTOMATIC FREQUENCY CONTROL PROCESSING IN MULTI-CHANNEL RECEIVERS

(75) Inventors: Wayne Wiggins Ballantyne, Coconut Creek, FL (US); Thomas Michael King, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/421,002

(22) Filed: Apr. 22, 2003

(65) Prior Publication Data

US 2004/0214538 A1 Oct. 28, 2004

(51) Int. Cl.
*H04B 1/18* (2006.01)

(52) U.S. Cl. .............................. 455/182.1; 455/164.2; 455/136; 455/192.2; 375/344; 375/339

(58) Field of Classification Search ................ 455/141, 455/136, 164.1, 164.2, 165.1, 166.1, 147, 455/456.1, 192.1, 192.2, 192.3, 196.1, 427, 455/208, 209, 258, 262, 259, 275, 575.1, 455/550.1, 77, 180.3, 182.1, 183.1, 184.1, 455/255, 313, 552.1, 257, 182.3, 183.2; 375/216, 375/219, 340, 344, 339, 152, 373–376, 140, 375/343, 130, 200, 354, 356, 208, 371, 206–207, 375/350, 149, 145, 326, 148, 324–327; 342/357.15, 342/357.06, 357.12, 357.02; 331/176, 14, 331/2, 177 R, 142
See application file for complete search history.

(56) References Cited

U.S. PATENT DOCUMENTS

| | | | |
|---|---|---|---|
| 5,416,808 A * | 5/1995 | Witsaman et al. .......... 375/356 |
| 5,654,718 A | 8/1997 | Beason et al. | |
| 5,841,396 A | 11/1998 | Krasner | |
| 5,856,766 A | 1/1999 | Gillig et al. | |
| 5,901,171 A | 5/1999 | Kohli et al. | |
| 6,009,118 A | 12/1999 | Tiemann et al. | |
| 6,121,923 A | 9/2000 | King | |
| 6,122,506 A | 9/2000 | Lau et al. | |
| 6,163,710 A * | 12/2000 | Blaser et al. ............. 455/552.1 |
| 6,208,291 B1 | 3/2001 | Krasner | |
| 6,208,292 B1 | 3/2001 | Sih et al. | |
| 6,424,826 B1 * | 7/2002 | Horton et al. ............... 455/255 |
| 6,546,040 B1 * | 4/2003 | Eschenbach ................. 375/140 |
| 6,618,006 B1 * | 9/2003 | Syrjarinne ............. 342/357.12 |
| 6,697,016 B1 * | 2/2004 | Voor et al. ............. 342/357.15 |
| 2004/0063411 A1 * | 4/2004 | Goldberg et al. ......... 455/192.2 |
| 2004/0142701 A1 * | 7/2004 | Abraham .................. 455/456.1 |

* cited by examiner

*Primary Examiner*—Edward F. Urban
*Assistant Examiner*—Charles Chow

(57) ABSTRACT

A multiple channel receiver (200) includes a communications receiver synthesizer (204) and at least one numerically controlled oscillator (NCO) (406) that produce local oscillator signals that are derived from a common reference oscillator (202). A DSP (212) and CPU (214) perform automatic frequency control (AFC) by adjustment of the reference oscillator (202) based upon a signal received by a receive channel using the local oscillator signal produced by the communications receiver synthesizer (204). The CPU (214) also provides a synchronous indication of adjustments to the reference oscillator (202) to control circuitry for the at least one NCO (406) so that the configuration of the NCO (406) can be altered so as to maintain a substantially constant frequency output during the adjustment of the reference oscillator (202).

20 Claims, 4 Drawing Sheets

AUTOMATIC FREQUENCY CONTROL PROCESSING IN MULTI-CHANNEL RECEIVERS

FIELD OF THE INVENTION

The present invention generally relates to the field of signal receivers, and more particularly relates to the operation of automatic frequency control in multiple channel receivers.

BACKGROUND OF THE INVENTION

Heterodyne radio frequency (RF) receivers are receivers that use one or more internally generated RF signals, referred to as local oscillators (LO), to aid in the reception of a radio signal. The LO signals are generated at a fixed frequency offset relative to the radio frequency of the radio signal to be received. The LO signal is mixed with the received radio signal to produce an "Intermediate Frequency" (IF) at the offset of the LO from the received radio signal. Some heterodyne RF receivers use an IF frequency of zero so that the tuned RF frequency is down-converted to a baseband or DC centered signal. Processing performed at the zero frequency IF is referred to as baseband processing.

The frequency stability of the LO signal within a receiver sets the tuned RF frequency accuracy of the receiver. LO signals are frequently generated with a synthesized RF signal generation process. Synthesized RF signal generation utilizes a frequency reference generator to generate a frequency reference signal that is generally at a relatively low frequency and a radio frequency signal is derived from this reference frequency signal by multiplying the reference frequency by a specified number. The output frequency of a synthesized RF signal generator can be varied during receiver operations by one of two techniques. The output frequency can be changed by reconfiguration of the signal derivation circuitry so that the input signal reference is multiplied by a different number. The output frequency of a synthesized RF signal generator can also be changed by varying the output frequency of the reference generator. Reconfiguration of the signal generation circuitry frequently results in a period of output signal instability before the newly derived output signal becomes stable and usable as an LO within a stable RF receiver. Tracking an RF frequency of a received signal is in many cases performed in a heterodyne receiver by changing the output frequency of the reference frequency oscillator driving the synthesized RF signal generator.

Some radio receivers are required to simultaneously receive multiple RF signals. These receivers often share a common frequency reference generator and use multiple RF synthesizers to generate one or more LO signals for each received signal.

Heterodyne RF receivers frequently track the frequency of the received RF signal or signals. Frequency tracking of the received RF signal is performed to accommodate short and long term frequency instability of both the internally generated LO signal and the RF signal that is being received. Tracking of the received RF signal is typically performed by adjusting the frequency of the LO signal generator so as to properly track the received RF signal. In order to improve reception during LO adjustments, radio receivers with synthesized LO generators sometimes track received signals by adjusting the frequency reference of the LO synthesizer. Radio receivers that receive multiple RF signals and that derive multiple LO signals from a single frequency reference are able to track only one received RF signal by adjustment of the frequency reference. A signal with a highly stable RF frequency is often chosen to be tracked by adjustment of the receiver's frequency reference. The other channels of these receivers typically track signals by changing the LO frequency by reconfiguration of the synthesized signal generator producing the LO signal. When the reference frequency of these receivers is adjusted to track one received signal, the other signals that are tracked by other channels of the RF receiver will be off-tuned from their tuned center frequency. If any other channel changes its tuned center frequency by more than the tracking bandwidth of that channel, the tracking of the received signal is lost. This requires this other channel to reacquire its RF signal, and often introduces periods of signal "drop-outs" where data communicated during this reacquisition is lost. Signals that require lengthy reacquisition processing, such as GPS signals, can be lost for an appreciable amount of time and degrade the usefulness of the receiver.

Therefore a need exists to overcome the problems with the prior art as discussed above.

SUMMARY OF THE INVENTION

According to a preferred embodiment of the present invention, a multiple channel receiver comprises a reference oscillator that produces a frequency reference signal and that further accepts a frequency adjustment. The receiver also comprises a first receiver, that is electrically coupled to the reference oscillator, and that receives at least a first transmitted signal that is transmitted at a first signal frequency. The first receiver tunes to a first tuned frequency based upon a first local oscillator signal that is derived from the frequency reference signal. The receiver also comprises a frequency reference adjustor, that is electrically coupled to the reference oscillator, and that produces the frequency adjustment. The receiver also comprises a second receiver, that is electrically coupled to the frequency reference adjustor, and that receives at least a second transmitted signal that is transmitted at a second signal frequency. The second receiver tunes to a second tuned frequency based upon a second local oscillator signal that is derived from the frequency reference signal. The second receiver further accepts an indication of the frequency adjustment and adjusts a relationship between the frequency reference signal and the second local oscillator signal in response to the indication of the frequency adjustment.

According to a preferred embodiment of the present invention, a method for receiving multiple signals comprises the steps of generating a frequency reference signal and tuning a first receiver to a first tuned frequency based upon a first local oscillator signal. The first local oscillator signal in this method is related to the frequency reference signal. This method then comprises tuning a second receiver to a second tuned frequency based upon a second local oscillator signal that is also derived from the frequency reference signal. The method then comprises commanding a frequency adjustment of the frequency reference signal and commanding an adjustment of a relationship between the frequency reference signal and the second local oscillator signal in response to the commanding of the frequency adjustment.

DETAILED DESCRIPTION

The present invention, according to a preferred embodiment, overcomes problems with the prior art by providing a multiple channel receiver that uses a single reference oscillator as a frequency reference signal generator for some or all of the local oscillators that are associated with the plurality of receiver channels incorporated into the multiple channel receiver, and then using a signal received by one of the plurality of receiver channels to perform automatic frequency control (AFC) of the single frequency reference oscillator. A transmitted signal that is transmitted at an accurate RF signal frequency is chosen to be the signal that is used to perform AFC. The other receiver channels of this receiver also derive local oscillator signals from the same frequency reference signal. The other receiver channels in the exemplary embodiments of the present invention are also provided with an indication of frequency adjustments that are applied to the reference oscillator, so as to allow the local oscillators of those other receiver channels to be adjusted in order to accommodate the frequency shift that is to be applied to the frequency reference signal. This operation allows the other receiver channels to maintain their tuned frequency even when the frequency of the output of the frequency reference oscillator is changed during AFC processing. Thus, the frequency reference signal of the receiver can be maintained at an accurate frequency and the signal acquisition performance of receiver channels that are acquiring new signals is improved while minimizing the affect of frequency reference signal adjustments on receiver channels that are receiving and tracking transmitted signals. This is of particular advantage in multiple channel receivers that are used to receive spread spectrum signals, such as GPS signal transmissions, since these signals frequently have extended acquisition processing that can be greatly aided by an accurate frequency reference. Providing the other receiver channels with an indication of frequency adjustments that are applied to the frequency reference signal allows receiver channels that are tracking signals to maintain their tracking of the received signal during the shift in the frequency of the output of the frequency reference oscillator caused by AFC operations and reduces or eliminates the loss of data when the frequency reference signal is adjusted.

Figure 1:
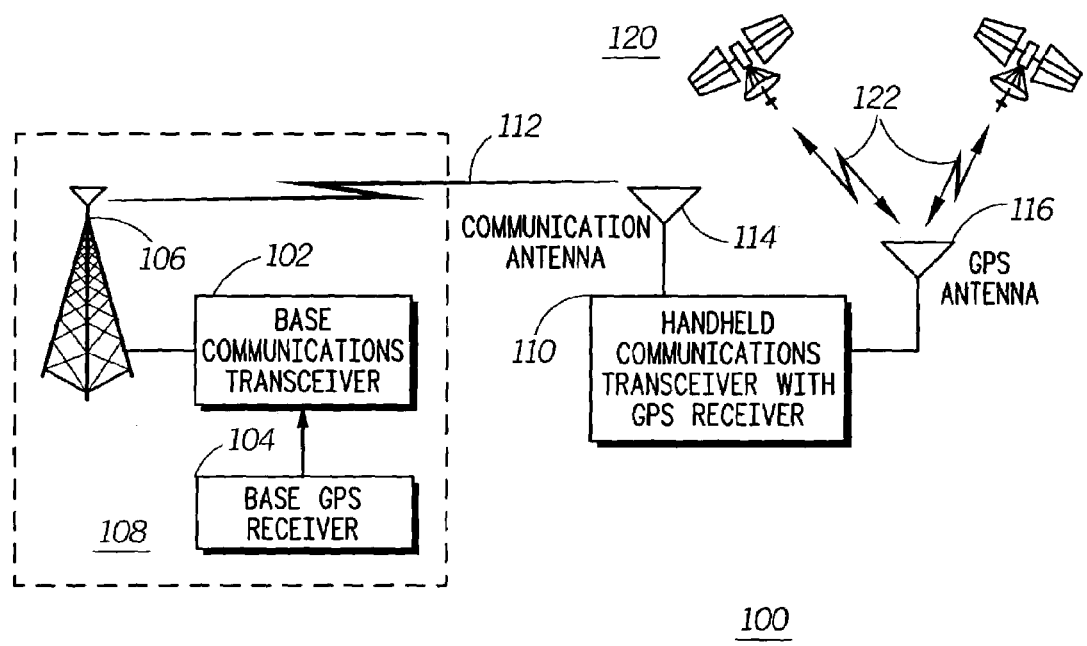
FIG. 1 is a block diagram illustrating a mobile communications system according to a preferred embodiment of the present invention.

The features and advantages of the present invention are described by reference to an exemplary embodiment of the present invention that is incorporated into a handheld radio communications transceiver that also includes an internal GPS receiver. An exemplary mobile communications system 100 that uses such a handheld radio communications transceiver is illustrated in FIG. 1. The exemplary mobile communications system 100 is shown to include a terrestrial communications base station 108 that has a base antenna 106, a base communications transceiver 102 and a base station GPS receiver 104. The base station GPS receiver 104 of this exemplary embodiment processes signals from the Global Positioning System (GPS) so as to derive highly accurate time and position references. The GPS receiver provides a highly stable base station frequency reference signal 114 to the base communications transceiver 102. Other embodiments of the base station 108, such as in GSM systems, utilize a rubidium oscillator as a frequency standard, instead of the base GPS receiver 104. The base communications transceiver 102 uses this base station frequency reference signal 114 to derive transmitted RF signals that are communicated over the wireless link 112. The base communications transceiver 102 of the exemplary embodiment is able to produce a transmitted signal with an RF signal frequency accuracy on the order of +/−0.2 ppm due to the accuracy of the GPS derived frequency reference signal 114. The base antenna 106 transmits these RF signals over a wireless link 112 to a handheld communications transceiver 110. Wireless link 112 is also used to communicate voice and/or data from the handheld communications transceiver 110 to the communications base station 108 or to other handheld communications transceivers (not shown). Alternative embodiments of the present invention incorporate wireless links 112 that include satellite transponders and/or various radio relay equipment. Other embodiments utilize base communications transceivers that are part of a satellite based communications network or are based upon satellites themselves.

The operation of the handheld communications transceiver 110 of the exemplary embodiment determines frequency errors in its internal frequency reference signal by comparison of a tuned frequency for a receiver and a signal frequency of a received signal that is carried across the wireless link 112. The frequency error of the frequency reference signal that is to be corrected by AFC processing is determined in this exemplary embodiment by measuring a frequency tuning error for the received signal as observed by the communications receiving circuits of the handheld communications transceiver 110. Since the RF signal that is transmitted by the base communications transceiver 102 of this embodiment has a highly accurate signal frequency, observed received signal frequency tuning errors are presumed to be due to errors in the frequency reference of the handheld receiver. The handheld communications transceiver 110 of this exemplary embodiment includes a GPS receiver that incorporates at least one receiver channels to receive GPS signals 122 from multiple GPS satellites 120. These at least one receiver channels share a common frequency reference signal, which is adjusted by tracking the signal received from the base station 108.

Embodiments of the present invention use conventional techniques to receive and process signals from multiple GPS satellites. Such conventional processing is generally performed with more GPS satellites in view than there are GPS receiver channels in the receiver by employing GPS receiver channel time sharing in the receiver to allow more satellites to be covered than the number of physical channels. If the receiver has at least as many GPS receiver channels as the number of satellites that are available, then it is possible to assign one satellite to each channel so that each satellite can be continuously tracked. The processing described below is applicable to receivers that perform GPS receiver channel time sharing. However, in order to more clearly and simply describe the operation of the exemplary embodiments of the present invention, the description relating to GPS receiver channel time sharing is omitted.

Figure 2:
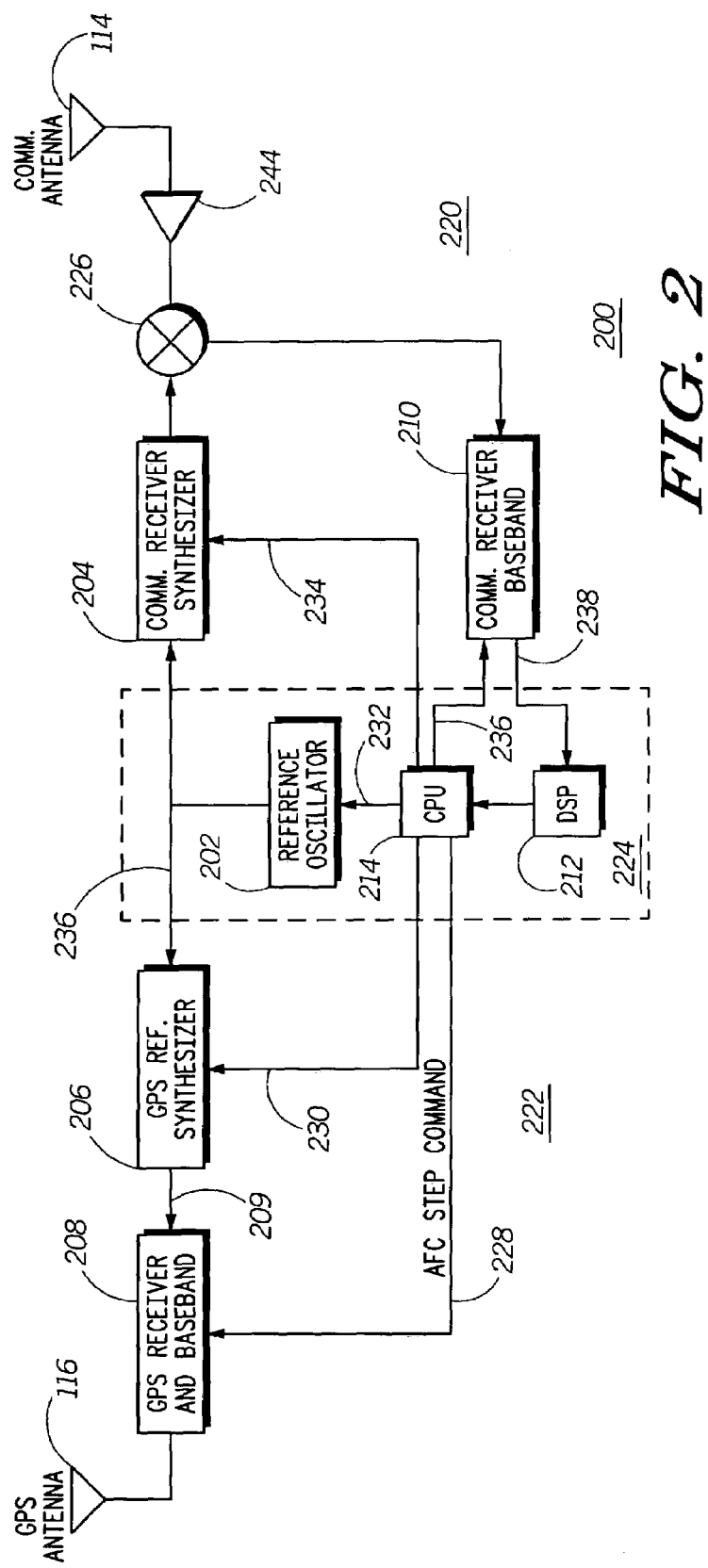
FIG. 2 is a block diagram of a combined receiver according to a preferred embodiment of the present invention.

A combined receiver 200 that is incorporated into the handheld communications transceiver 110 according to an exemplary embodiment of the present invention is illustrated in FIG. 2. The handheld communications transceiver 110 also contains transmitter circuits and other circuits that are not shown and are not relevant to the operation of this embodiment of the present invention. The combined receiver 200 of the exemplary embodiment is a multiple channel receiver that has one communications receiver channel and multiple GPS receiver channels. The combined receiver 200 has communications components 220 that are circuits used to perform the functions of a receiver channel used to receive communications signals, such as the signal transmitted by the base station 108. The combined receiver 200 also has GPS components 222 that contain receiver channels for receiving GPS signals 122 as well as circuits to perform other functions of a GPS receiver that are used, for example, to determine the position of the GPS antenna 116. The combined receiver 200 further has shared components 224 that are used to support the operation of both the communications and GPS receiver channels. The shared components 222 are also used for other functions that are not shown, including support of the communications transmitter functions of the handheld communications transceiver 110.

The communications components 220 of the exemplary embodiment include a communications receiver synthesizer 204, an RF mixer 226, a communications antenna 113, a communications RF amplifier 244 and a communications receiver baseband processing unit 210. The communications components 220 of the exemplary embodiment are used to receive signals transmitted along the wireless communications link 112. The received RF signal is captured by the communications antenna 113 of the exemplary embodiment and is routed to the RF amplifier 244 prior to down-conversion by the RF mixer 226.

The Communications receiver synthesizer 204 generates an RF local oscillator that is provided to the RF mixer 226 to properly down-convert the received RF signal to a baseband signal. In order to more clearly describe the functioning of the combined receiver 200, the down-conversion processing is illustrated as a single mixer. Other circuitry, such as filtering and amplification stages, are not shown but are understood to be part of the internal processing of the RF mixer 226. Further embodiments of the present invention utilize multiple stage down-conversion processes and/or provide a non-zero intermediate frequency as an output instead of the baseband output of the exemplary embodiment.

The communications receiver synthesizer 204 accepts a frequency reference signal 236 that is generated by a reference oscillator 202 and derives a local oscillator (LO) output signal from the frequency reference signal 236 by multiplying the frequency of the frequency reference signal 236 by a specified number. The communications receiver synthesizer 204 accepts a frequency command 234 from the CPU 214 to allow the changing of the tuned frequency of the communications channel. The communications frequency synthesizer 204 of the exemplary embodiment is a "fractional-N" synthesizer that allows increased flexibility in the setting of the frequency of its output signal.

The frequency of the output signal of the communications receiver synthesizer 204 is based upon the frequency of the output of the reference oscillator 202. Changes in the frequency of the output signal of the reference oscillator 202 are directly reflected in the frequency of the communications receiver synthesizer 204 and therefore in the tuned RF frequency of the communications receiver. The processing of the communication receiver baseband processing unit 210 produces an observed frequency error output 238. The observed frequency error output 238 indicates the measured difference between the received RF signal and the tuned center frequency of the receiver channel used to receive the communications signal. The exemplary embodiment of the present invention uses this measured error to correct or adjust the output frequency of the reference oscillator 202, as is described below.

The GPS components 222 include a GPS reference synthesizer 206, a GPS antenna 116 and a GPS receiver and baseband unit 208. The exemplary embodiment contains multiple GPS components 222 that are either dedicated to a single GPS satellite or timeshared to receive signals from multiple satellites using conventional techniques. The following description relates to one representative set of GPS components 222 for the purposes of clarity and simplicity.

The GPS reference synthesizer 206 accepts a GPS synthesizer frequency command 230 from the CPU 214. The GPS receiver and baseband unit 208 includes multiple receiver channels that are used to receive and process GPS signals 122 from multiple GPS satellites 120. The GPS receiver and baseband unit 208 accepts a GPS reference signal 209 from a GPS reference synthesizer 206 and uses this signal to derive one or more local oscillator signals for each GPS signal receiver channel. The output frequencies of the local oscillator output signals generated within the GPS receiver and baseband unit 208 are derived from the GPS reference synthesizer output 209, which is derived from the output of the reference oscillator 202. Therefore, any changes in the frequency of the output signal generated by the reference oscillator 202 are reflected by an equal and opposite proportional amount in the local oscillator signals generated within the GPS receiver and baseband unit 208 unless measures are taken to obviate this effect. The GPS receiver and baseband unit 208, which is specific to each satellite, of the exemplary embodiment accepts an Automatic Frequency Control (AFC) step command 228 to compensate for changes initiated by the CPU 214 in the output frequency of the reference oscillator 202, as is described below.

The shared components 224 include a central processing unit (CPU) 214, a digital signal processing unit (DSP) 212 and a reference oscillator 202. The CPU 214 and DSP 212 of the exemplary embodiment perform processing associated with the present invention, as is described herein, as well as other functions in the control and operation of the combined receiver 200 and handheld transceiver 110 that are not relevant to the present invention. The reference oscillator 202 of the exemplary embodiment is essentially a crystal oscillator (XO) or possibly a temperature controlled crystal oscillator (TCXO) that accepts a frequency adjustment digital offset command over an offset command interface 232. The digital offset command adjusts the output frequency of the frequency reference signal 236 to compensate, for example, for observed output frequency errors of the reference oscillator 202. This error is determined by the DSP 212 from the highly accurate (in terms of frequency) communication signal 112 that is received by antenna 113. The reference oscillator 202 generates a sinusoidal output that is maintained at a stable frequency based upon a crystal reference and the digital offset command. The exemplary embodiment of the present invention utilizes a reference oscillator 202 that has less frequency accuracy, due to manufacturing tolerances, cost considerations, and temperature sensitivity, than the frequency accuracy of the received communications signal. The exemplary embodiment corrects or adjusts the frequency of the frequency reference signal 236 based upon tuning frequency errors observed for the received communications signal by changing the frequency offset command sent to the reference oscillator 202.

The exemplary embodiment of the present invention utilizes a transmitted communications signal 112 that carries a digital data stream. The combined receiver 200 uses conventional processing techniques on the received digital data signal in order to determine frequency tuning errors between the tuned frequency of the receiver channel and the transmitted signal frequency of the received signal. The communications receiver baseband unit 210 of the exemplary embodiment converts the phase modulated communications signal to baseband, so that phase errors between the local oscillator and the received signal are observed as phase offsets within the expected values of the baseband signal during the symbol sampling period of the receiver. The processing of the DSP 212 and CPU 214 operate as a frequency reference adjustor to determine the frequency adjustment of the local oscillator frequency that will correct the observed phase errors in the local oscillator output produced by the communications receiver synthesizer 204 and properly track the received signal, as is well known in the relevant arts. The CPU 214 then provides this frequency adjustment in the form of a digital frequency offset command 232 to the reference oscillator 202 to implement the required change in the local oscillator frequency.

The required adjustment to the frequency reference signal 236 output by the reference oscillator 202 is a function of the relationship between the output frequency of the reference oscillator 202 and the output frequency of the communications receiver synthesizer 204. An exemplary operation of the communications components 220 has the communications frequency synthesizer 204 multiplying the frequency of the frequency reference signal 236 by forty-two (42). In this example, the digital frequency offset command provided to the reference oscillator 202 is the frequency error observed for the received signal divided by forty-two. Adjusting the frequency to the reference oscillator 202 by tracking the received signal in this manner allows the accuracy of the reference oscillator 202 to be established by the frequency accuracy of the received signal. Adjustments in frequency can be considered either as absolute values of frequency (i.e., the frequency difference that is to be implemented), or an adjustment can be considered in parts-per-million (ppm). Frequency errors and adjustments specified in ppm are sometimes more convenient in considering the operation of receivers that utilize synthesizers that have signals with different frequencies that are all derived from a common frequency reference signal 236.

Figure 3:
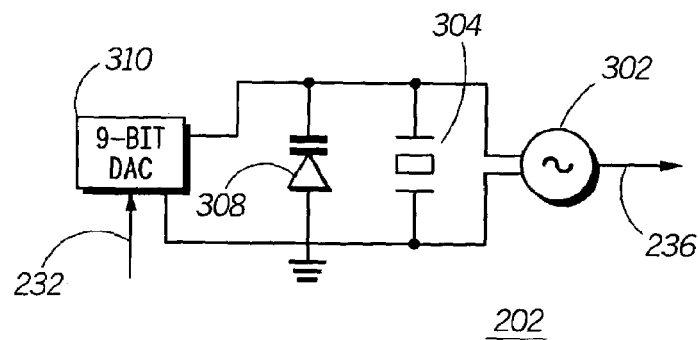
FIG. 3 is a block diagram of a reference oscillator according to a preferred embodiment of the present invention.

A reference oscillator 202 as is used by the combined receiver of the exemplary embodiment of the present invention is illustrated in FIG. 3. The reference oscillator 202 has an oscillator circuit 302 that is controlled by a crystal 304. The crystal is in parallel with a varactor tuning diode 308 that is driven by a 9-bit digital to analog converter (DAC) 310. The voltage output of the DAC changes the capacitance value of the varactor diode, thus adjusting the operating frequency of the crystal oscillator. The DAC output port represents a high impedance at the frequency of the crystal oscillator, so that it does not load down the oscillator circuit. This allows the output frequency of the reference oscillator 202 to be adjusted by providing different digital offset commands over the offset command interface 232.

The combined receiver 200 of the exemplary embodiment of the present invention incorporates GPS components 222 that are able to simultaneously receive signals from multiple GPS satellites. The GPS receiver and baseband unit 208 accepts a GPS reference signal 209 that is generated by the GPS reference synthesizer 206. In order to provide a stable reference signal for the receiving circuits of the GPS receiver and baseband unit 208, the GPS reference synthesizer 206 derives the GPS reference signal 209 from the frequency reference signal 236.

The GPS receiver and baseband unit 208 as used by the exemplary embodiment of the present invention contains at least one receiver channels that each have an independent local oscillator. The GPS receiver and baseband unit 208 provides at least one numerically controlled oscillator (NCO) as a local oscillator for each receiver channel. The outputs of these NCOs are based upon the frequency of the GPS reference synthesizer 206. Changes in the output frequency of the GPS reference synthesizer 206 directly affect the frequency of these NCOs and therefore the tuned frequency of all of the GPS receiver channels within the GPS receiver and baseband unit 208. The changes of the frequency of the output signal of the reference oscillator 202 that are made as part of the AFC processing of the exemplary embodiment can cause disruption in the reception of the GPS signals by the GPS receiver and baseband unit 208. The GPS signal and baseband unit 208 of the exemplary embodiment obviates any disruption due to changes in the frequency of the frequency reference signal 236 by accepting an AFC step command 228 from the CPU 214 that is synchronized with the frequency change command issued by the CPU 214 to the reference oscillator 202. The AFC step command 228 is an indication of the frequency adjustment that is being applied to the reference oscillator 202. The GPS reference synthesizer 206 generates a signal with a frequency that is a known multiple of the frequency reference signal 236. The CPU 214 provides a GPS synthesizer command to the GPS reference synthesizer 206 that specifies the number by which the frequency of the frequency reference signal 236 is to be multiplied. This number similarly multiplies any change in the frequency of the frequency reference signal 236 and the AFC step command 228 provided to the GPS receiver and baseband unit 208 also reflects this multiplier number. The AFC step command 228 is applied to each NCO of the GPS receiver and baseband unit 208 at the time a frequency change is made in the output of the reference oscillator 202 under the control of the CPU 214. The absolute frequency shift required for the output of the reference oscillator 202, GPS reference synthesizer 206, NCO outputs, as well as the originally determined adjustment requirement for the output of the communications receiver synthesizer 204, differ due to different absolute frequency values for each of these signals. The required frequency shifts for all of these signals, however, equate to the same part-per-million (ppm) value since they are all derived from a common frequency reference. This relationship of adjustments based upon ppm values facilitates efficient processing in the CPU of the exemplary embodiment.

Figure 4:
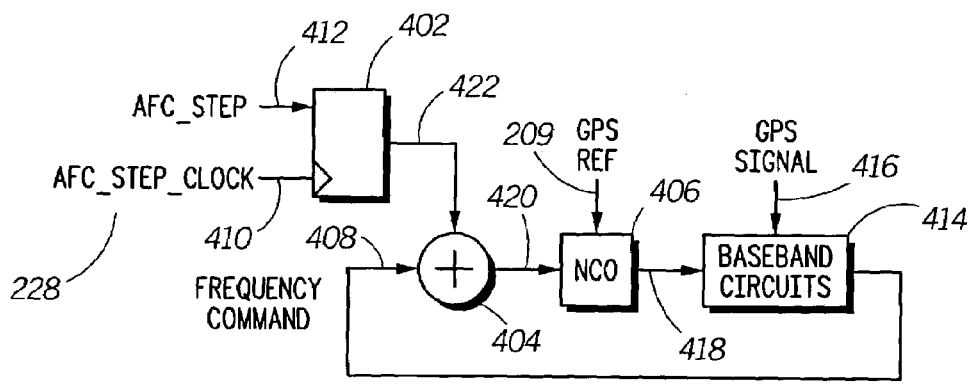
FIG. 4 is a block diagram of an NCO based local oscillator according to a preferred embodiment of the present invention.

A portion of a GPS receiver channel 400 that is incorporated in the exemplary embodiment of the present invention is illustrated in FIG. 4. The GPS receiver channel 400 has an NCO 406 that accepts the GPS reference signal 209 and generates a local oscillator signal 418 that is used by the baseband circuits 414. The baseband circuits 414 accept a GPS signal 416 that has been converted to an appropriate intermediate frequency and further conditioned by a preceding stage that is not shown for ease of understanding. The baseband circuits 414 process the GPS signal 416 in a conventional manner and produce, among other data, an updated frequency command 408 to the NCO 406 so that the received GPS signal 416 is properly tracked according to a closed loop tracking algorithm that is implemented by the GPS receiver channel.

The NCO 406 accepts a GPS reference signal 209 upon which the output frequency of the NCO is based. In order to accommodate changes in the frequency of the GPS reference signal 209 that are caused by adjustments to the reference oscillator 202, the GPS receiver channel 400 of the exemplary embodiment of the present invention receives an AFC step command that is added to the frequency command 408 in order to produce a modified frequency command 420. The AFC step command 228 is used to adjust the relationship between the GPS reference signal 209 and the local oscillator signal produced by the NCO 406 of the GPS receiver channel 400 in response to the frequency adjustment that is applied to the reference oscillator 202.

The AFC step command 228 has two components. One component is an AFC step value 412 that contains the frequency shift amount that the GPS receiver and baseband unit 208 is required to accommodate. The CPU 214 of the exemplary embodiment provides a properly formatted AFC step value 412 as is required by the design of the GPS receiver channel 400. The other component of the AFC step command 228 is an AFC step clock 410 that is a synchronization signal that corresponds to the time at which the frequency adjustment is applied to the reference oscillator 202 and therefore the time at which the output frequency of the reference oscillator 202 is changed or begins to change. These two components are provided as input to a step command latch 402. The step command latch 402 retains its previous value as a frequency adjustment output 422 until the AFC step clock 410 input indicates the frequency adjustment is to be made. This is indicated by a positive going edge of the AFC step clock 410 in the exemplary embodiment. Upon this indication, the frequency adjustment output 422 is changed to reflect the received AFC step value 412, and this value is added to the frequency command 408 by adder 404. The sum of these two values is the modified frequency command 420 that is used as a frequency command input to the NCO 406. This allows the frequency shift that is needed to accommodate changes in the frequency of the GPS reference signal 209 to be directly made by the NCO 406 in anticipation of that change without requiring the GPS signal re-acquisition processing that is conventionally used, and which may take on the order of several seconds for the case of weak GPS signals.

The exemplary embodiment described above has a reference oscillator 202 that has a response time for frequency offset commands that is small relative to the received signal tracking loop time constant for the GPS receiver and baseband unit 208. This allows the output of the GPS local oscillator, the NCO 406, to be adjusted in a step-wise manner, as is described above, while the frequency of the local oscillator signal is maintained within the tracking bandwidth of the receiver channel. In such embodiments, the GPS receiver channels are considered to be non-reference receiver channels, i.e., receiver channels that are not used to receive a signal to be used for the adjustment of reference oscillator 202. Other embodiments of the present invention have non-reference receiver channels that have signal tracking bandwidths that correspond to time constants that are short in relation to the response time of the reference oscillator 202 to offset frequency commands. This precludes step-wise adjustment of the local oscillators used by those non-reference channels since the output of the reference oscillator 202 will change more slowly than the local oscillator signal of the receiver channel. Improper tracking of the changing frequency of the frequency reference signal 236 by the local oscillator signal of the receiver channel may result in improper tracking of the received signal and the loss of signal tracking by the non-reference receiver channel.

An alternative embodiment of the present invention uses a shaping circuit to properly shape the change in the NCO output frequency in response to the AFC step command 228. These embodiments recognize that the reference oscillator 202 has a certain time-domain response to frequency adjustment commands. This shaping circuit implements a second time domain response that causes the frequency command inputs that are provided to the NCO 406 to change in time with the expected change in the frequency reference signal 236 and to therefore produce a more constant NCO output frequency as the frequency reference input to the NCO changes. The second time domain response that is implemented by this shaping circuit is selected to be close to the time domain response of the reference oscillator 202 to frequency adjustment commands. An exact match of these two time domain response provides optimal performance. It is to be noted, however, that a matching of these time domain responses that results in maintenance of the NCO output within the tracking bandwidth of the receiver channel during adjustment of the reference oscillator 202 is adequate to maintain tracking of a received signal.

Figure 5:
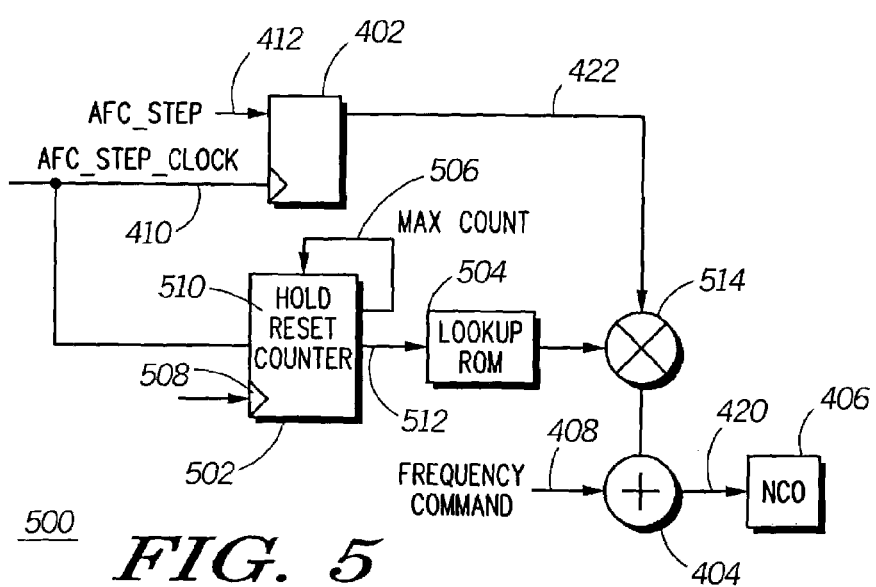
FIG. 5 is a block diagram of an NCO based local oscillator according to another embodiment of the present invention.

A frequency response shaping circuit 500 according to this alternative embodiment is illustrated in FIG. 5. The frequency response shaping circuit 500 accepts the same two components of the AFC step command 228 that are described above. The AFC step command 412 is similarly latched into the step command latch 402 in response to the AFC step clock signal 410.

In addition to the step command latch 402, the frequency response shaping circuit 500 has a lookup ROM 504 that contains a stored time domain step response that matches the frequency change step response of the reference oscillator 202 and synthesizer chain that is to be matched by the frequency shift of the output of the NCO 406 upon receipt of an AFC step command 228. In the example of the GPS receiver given above, this is the step response of the reference oscillator 202 and the GPS reference synthesizer 206 to an offset frequency command provided over the offset frequency command interface 232. The contents of ROM 504 of this embodiment are determined by characterization of this step response performed before or during the circuit manufacturing process.

The content of the lookup ROM 504 is addressed by a counter output 512. The counter output 512 of this embodiment is a multiple data line signal that contains multiple data bits corresponding to the count value of counter 502. The counter 502 has a clock input 508. The counter starts with a counter output 512 value of zero and increments the value of the counter output with each cycle of the clock input 508. The period of the clock input 508 is chosen according to the time scale of the time domain step response data stored within lookup ROM 504. Counter 502 produces a maximum count output 506, which indicates that the counter has reached its maximum count value. The maximum count output 506 is provided to a hold input of the counter 502 that causes the counter output 512 to stop increasing so that the counter output 512 retains its value.

The counter 502 of this embodiment has a reset input which causes the counter output 512 to be reset to zero. This also causes the maximum count output 506 to be deasserted. This allows the counter output 512 to begin counting from zero and then be incremented with each cycle of the clock input 508. The period of the clock input 508 of this embodiment is selected to implement the required time domain shaping of the frequency step in the output of the NCO 406. The output of the counter 502 is provided as an addressing input to the lookup ROM 504. The data of the lookup ROM 504 that corresponds to the address of the current count value contained on the counter output 512 is produced as a first input to multiplier 514. The step command latch 402 latches the AFC step command 412 as described above and provides this output as a second input to multiplier 514. This results in the magnitude of the AFC step command 412 being shaped according to the time domain response values stored within lookup ROM 504. The output of multiplier 514 is provided to adder 404 and is summed with the frequency command 408, as is described above.

The counter output 512 increases with each cycle of the clock input 508 until the maximum count is reached. The maximum count is indicated by the maximum count output 506, which is supplied to the hold input of the counter 502. This causes the counter output 512 to stop increasing and the output of multiplier 514 to be held constant.

Figure 6:
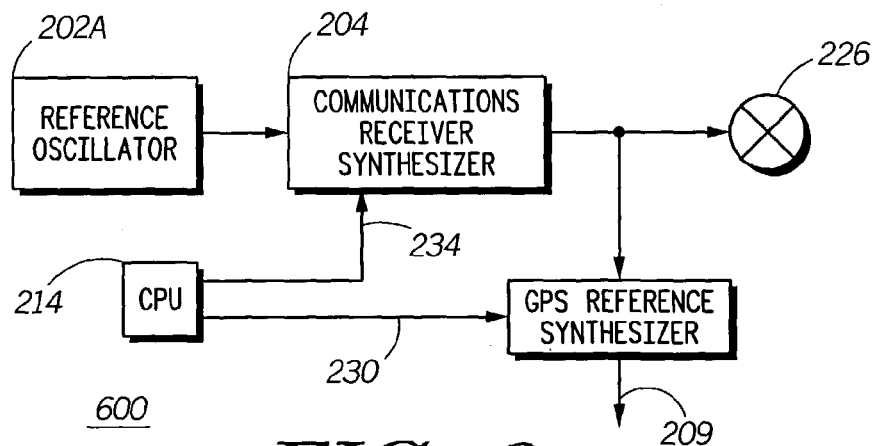
FIG. 6 is a block diagram of a reference oscillator structure according to another embodiment of the present invention.

Further embodiments of the present invention have different frequency generation circuit configurations for the various LO frequencies used by the multiple receiver channels. One embodiment utilizes an alternative frequency synthesizer chain 600 that is illustrated in FIG. 6. The alternative frequency synthesizer chain 600 has a reference oscillator 202a and communications receiver synthesizer 204 that are similar to the combined receiver 200. The reference oscillator 202a produces a reference signal 236 that is an input to the communications receiver synthesizer 204. This alternative embodiment of the present invention does not adjust the output frequency of reference oscillator 202a but rather compensates for frequency offsets of the reference oscillator 202a by commanding different frequency multiplication values within the communications receiver synthesizer 204. The output of the communications receiver synthesizer 204 therefore has a frequency accuracy that is determined by the frequency accuracy of the received communications signal even though the reference oscillator 202 is not directly adjusted. The GPS reference synthesizer 206a therefore has a stable input frequency reference and is able to produce a signal with a stable output frequency. These embodiments adjust the multiplication factor used by the GPS reference synthesizer 206a whenever the multiplication factor of the communications receiver synthesizer 204 is adjusted in response to an observed frequency error in the communications signal receiver. The GPS reference synthesizer output 209 is then used as described above.

Figure 7:
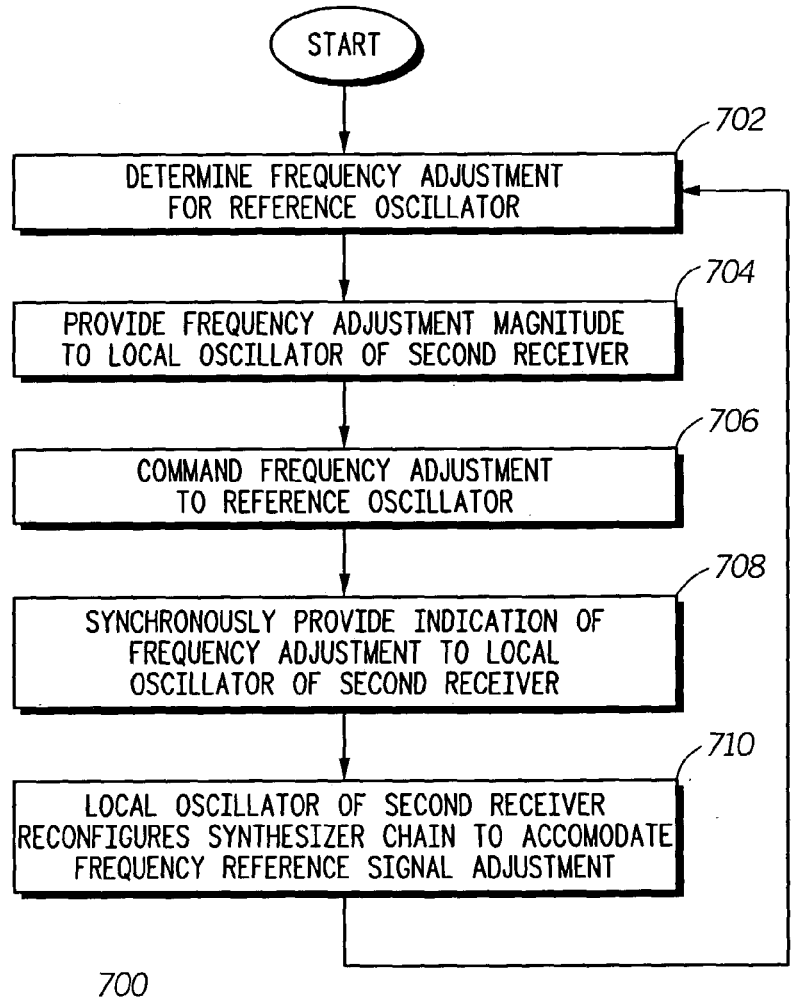
FIG. 7 is a processing flow diagram illustrating the automatic frequency control processing of a multiple channel receiver according to preferred embodiments of the present invention.

A processing flow diagram 700 according to an exemplary embodiment of the present invention is illustrated in FIG. 7. The processing flow begins by determining, at step 702, a frequency adjustment that is to be provided to the reference oscillator 202. This determination is able to be performed immediately or after a delay according to the requirements of the particular embodiment. The processing then provides, at step 704, data to the local oscillator of a second receiver. The data provided in this step indicates the magnitude of the frequency adjustment that will be applied to the reference oscillator 202. The processing then commands, at step 706, the reference oscillator to implement the frequency adjustment. The processing then (preferably simultaneously) provides, at step 708, to the local oscillator of the second receiver an indication of the frequency adjustment. The CPU 214 provides this data in the exemplary embodiment described above. The indication of the frequency adjustment in the exemplary embodiment is in the form of an AFC step clock signal 410, as is described above. The processing of the exemplary embodiment then reconfigures, at step 710, the local oscillator of the second receiver so as to maintain a constant frequency output during the change in reference frequency signal that results from the frequency adjustment. The reconfiguration is able to be a step-wise process or a process with a time domain response, as is described above.

Accordingly, preferred embodiments of the present invention allow more effective sharing of a single frequency reference oscillator between multiple receiver channels in a multiple channel receiver. These embodiments allow for AFC processing to be performed on the single frequency reference oscillator by using one receiver channel while minimizing the affect of the AFC processing on the other receiver channels that derive a local oscillator from that frequency reference oscillator. This results in cost, size and power savings by obviating the need for a separate frequency reference for the multiple receiver channels, such as for the multiple receiver channels of a multiple channel receiver that simultaneously receives both communications and GPS signals, while at the same time preventing loss of tracking of the received signal. In the preferred embodiment, GPS signal tracking is not lost because tuned frequency changes in the GPS receiver are limited to less than the tracking bandwidth of the GPS receiver when the AFC processing adjusts the output frequency of the frequency reference oscillator.

The present invention can be realized in hardware, software, or a combination of hardware and software. A system according to a preferred embodiment of the present invention can be realized in a centralized fashion in one information processing system, or in a distributed fashion where different elements are spread across several interconnected information processing systems. Any kind of information processing system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a information processing system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each information processing system may include, inter alia, one or more information processing devices and/or computers and at least a machine readable medium allowing a device to read data, instructions, messages or message packets, and other machine readable information from the machine readable medium. The machine readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the machine readable medium may comprise information in a transitory state medium such as a network link and/or a network interface, including a wired network or a wireless network, that allow a computer to read such machine readable information.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for generating a reference frequency, the method comprising the steps of:
   generating a frequency reference signal;
   generating an RF local oscillator signal derived from the frequency reference signal at a communications synthesizer of a communications receiver;
   commanding a frequency adjustment for adjusting a frequency of the frequency reference signal;
   generating a GPS local oscillator signal, a frequency of the GPS local oscillator signal being derived from the reference signal and having a tune; and
   adjusting, in response to and substantially in synchronization with the commanding the frequency adjustment, the frequency of the GPS local oscillator signal based upon the frequency adjustment to maintain the tune of the GPS local oscillator signal;
   wherein the adjusting step includes the sub-step of adjusting a relationship between the GPS local oscillator signal and the reference signal.

2. The method according to claim 1, wherein the step of generating a GPS local oscillator signal includes the sub-steps of:
   receiving a transmitted signal with the first receiver; and
   determining the frequency adjustment based upon a frequency tuning error for the transmitted signal.

3. The method according to claim 1, wherein the step of generating a GPS local oscillator signal is performed using a fractional-N frequency synthesizer.

4. The method according to claim 1, wherein the step of generating a GPS local oscillator signal is performed using a numerically controlled oscillator.

5. A multiple channel receiver comprising:
   a reference oscillator for producing a frequency reference signal, the reference oscillator accepting a frequency adjustment;
   a first receiver, electrically coupled to the reference oscillator, for receiving at least a first transmitted signal that is transmitted at a first signal frequency, the first receiver tuning to a first tuned frequency based upon a first local oscillator signal that is derived from the frequency reference signal;
   a frequency reference adjustor, electrically coupled to the reference oscillator, for producing the frequency adjustment; and
   a second receiver, electrically coupled to the frequency reference adjustor, for receiving at least a second transmitted signal that is transmitted at a second signal frequency, the second receiver tuning to a second tuned frequency that is derived from the frequency reference signal,
   wherein the second receiver accepts an indication of the frequency adjustment and adjusts, in response to and substantially in synchronization with the frequency reference adjustor producing the frequency adjustment to the reference oscillator, a relationship between the frequency reference signal and the second local oscillator signal to maintain the second tuned frequency.

6. The receiver according to claim 5, wherein the frequency reference adjustor determines the frequency adjustment by observing a frequency tuning error between the first tuned frequency and first signal frequency.

7. The receiver according to claim 5, wherein the second local oscillator signal is derived from the first local oscillator signal.

8. The receiver according to claim 5, wherein the indication of the frequency adjustment includes a step value and a synchronization signal that corresponds to an application time for the frequency adjustment.

9. The receiver according to claim 5,
   wherein the reference oscillator changes output frequency in response to the frequency adjustment with a first time domain response, and
   the second receiver adjusts the relationship between the frequency reference signal and the second local oscillator signal with a second time domain response tat substantially corresponds to the first time domain response.

10. The receiver according to claim 5, wherein the second receiver comprises a plurality of receiver channels.

11. A method for receiving multiple signals, said method comprising the steps of:
    generating a frequency reference signal at a reference oscillator;
    tuning a first receiver to a first tuned frequency based upon a first local oscillator signal, the first local oscillator being related to the frequency reference signal;
    tuning a second receiver to a second tuned frequency based upon a second local oscillator signal that is derived from the frequency reference signal;
    commanding a frequency adjustment of the frequency reference signal of the reference oscillator; and
    commanding, in response to and substantially in synchronization with the commanding the frequency adjustment of the frequency reference signal, an adjustment of a relationship between the frequency reference signal and the second local oscillator signal to maintain the second tuned frequency.

12. The method according to claim 11, further comprising the steps of:
    receiving a transmitted signal with the first receiver; and
    determining the frequency adjustment based upon a frequency tuning error for the transmitted signal.

13. The method according to claim 11, wherein the frequency reference signal is produced by the first local oscillator and a frequency of the second local oscillator signal is derived from the first local oscillator signal.

14. The method according to claim 11, wherein the commanding of an adjustment of the relationship is performed in response to an indication of the commanding a frequency adjustment the indication of the commanding a frequency adjustment corresponding to an application time for the frequency adjustment.

15. The method according to claim 11,
    wherein the frequency reference signal changes frequency in response to the frequency adjustment with a first time domain response, and
    the relationship between the frequency reference signal and the second local oscillator signal is adjusted with a second time domain response that substantially corresponds to the first time domain response.

16. The method according to claim 11, wherein the second receiver comprises a plurality of receiver channels.

17. A machine-readable medium encoded with a program product, the program product comprising instructions for performing the steps of:
generating a frequency reference signal at a reference oscillator;
tuning a first receiver to a first tuned frequency based upon a first local oscillator signal, the first local oscillator being related to the frequency reference signal;
tuning a second receiver to a second tuned frequency based upon a second local oscillator signal that is derived from the frequency reference signal;
commanding a frequency adjustment of the frequency reference signal of the reference oscillator; and
commanding, in response to and substantially in synchronization with the commanding the frequency adjustment of the frequency reference signal, an adjustment of a relationship between the frequency reference signal and the second local oscillator signal to maintain the second tuned frequency.

18. The machine-readable medium according to claim 17, further comprising instructions for performing the steps of:
receiving a transmitted signal with the first receiver; and
determining the frequency adjustment based upon a frequency tuning error for the transmitted signal.

19. The machine-readable medium according to claim 17, wherein the frequency reference signal is produced by the first local oscillator and a frequency of the second local oscillator signal is derived from the first local oscillator signal.

20. The machine-readable medium according to claim 17, wherein the frequency reference signal changes frequency in response to the frequency adjustment with a first time domain response, and
the relationship between the frequency reference signal and the second local oscillator signal is adjusted with a second time domain response that substantially corresponds to the first time domain response.

* * * * *